United States Patent
Wahl et al.

(10) Patent No.: US 9,559,048 B2
(45) Date of Patent: Jan. 31, 2017

(54) CIRCUIT CARRIER AND METHOD FOR PRODUCING A CIRCUIT CARRIER

(75) Inventors: Ruben Wahl, Kernen (DE); Andreas Arlt, Marbach (DE); Frieder Sundermeier, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 1070 days.

(21) Appl. No.: 13/236,620

(22) Filed: Sep. 19, 2011

(65) Prior Publication Data
US 2012/0067627 A1 Mar. 22, 2012

(30) Foreign Application Priority Data

Sep. 21, 2010 (DE) .................... 10 2010 041 121

(51) Int. Cl.
| H05K 1/03 | (2006.01) |
|---|---|
| H01L 23/498 | (2006.01) |
| H05K 3/20 | (2006.01) |
| H05K 1/02 | (2006.01) |
| H05K 3/00 | (2006.01) |
| H05K 3/42 | (2006.01) |

(52) U.S. Cl.
CPC ......... *H01L 23/49861* (2013.01); *H05K 3/202* (2013.01); *H01L 2924/0002* (2013.01); *H05K 1/0271* (2013.01); *H05K 3/0035* (2013.01); *H05K 3/421* (2013.01); *H05K 2201/068* (2013.01); *H05K 2201/09118* (2013.01); *H05K 2201/09563* (2013.01)

(58) Field of Classification Search
CPC .............. H01L 23/49861; H01L 2924/0002; H05K 3/0035; H05K 3/202; H05K 1/0271; H05K 3/421
USPC .............. 174/255, 250, 251, 253, 256–258
See application file for complete search history.

(56) References Cited

U.S. PATENT DOCUMENTS

| 5,889,658 A | * | 3/1999 | Sullivan .................. G01P 1/023 |
|---|---|---|---|
| | | | 257/692 |
| 5,981,979 A | * | 11/1999 | Brunner .......................... 257/99 |
| 8,089,159 B1 | * | 1/2012 | Park et al. .................... 257/773 |
| 2002/0020548 A1 | | 2/2002 | Takenaka et al. |
| 2007/0003195 A1 | | 1/2007 | Ice et al. |
| 2009/0212316 A1 | * | 8/2009 | Braune et al. .................. 257/99 |

FOREIGN PATENT DOCUMENTS

| CN | 101688814 A | 3/2010 |
|---|---|---|
| DE | 10 2007 031 980 | 1/2009 |
| EP | 1 718 139 A2 | 11/2006 |
| EP | 2 094 068 A1 | 8/2009 |
| GB | 2 290 912 A | 1/1996 |
| WO | 92/10079 A1 | 6/1992 |

* cited by examiner

*Primary Examiner* — Tremesha S Willis
(74) *Attorney, Agent, or Firm* — Maginot, Moore & Beck LLP

(57) ABSTRACT

A circuit carrier is disclosed that includes a base body having two flat sides and a plurality of narrow sides, a first conductor track applied to a first flat side of the base body, and a leadframe arranged in the interior of the base body. A method for producing the circuit carrier is also disclosed.

19 Claims, 3 Drawing Sheets

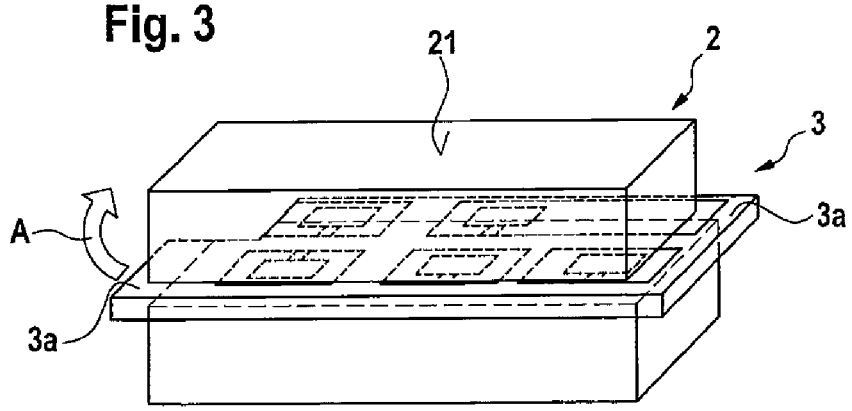
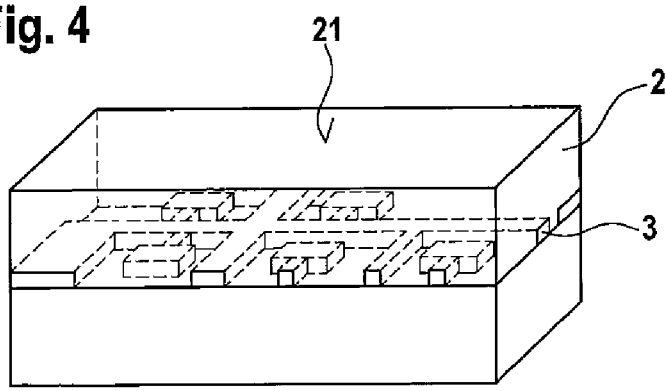
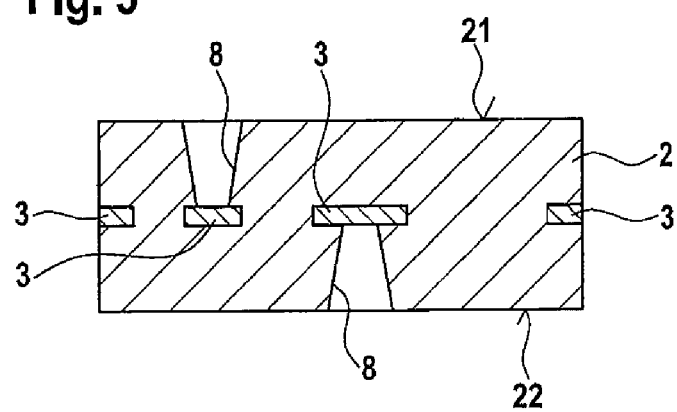

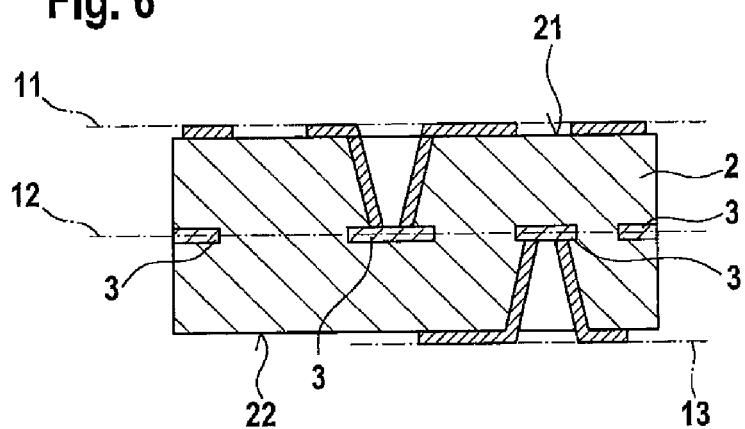
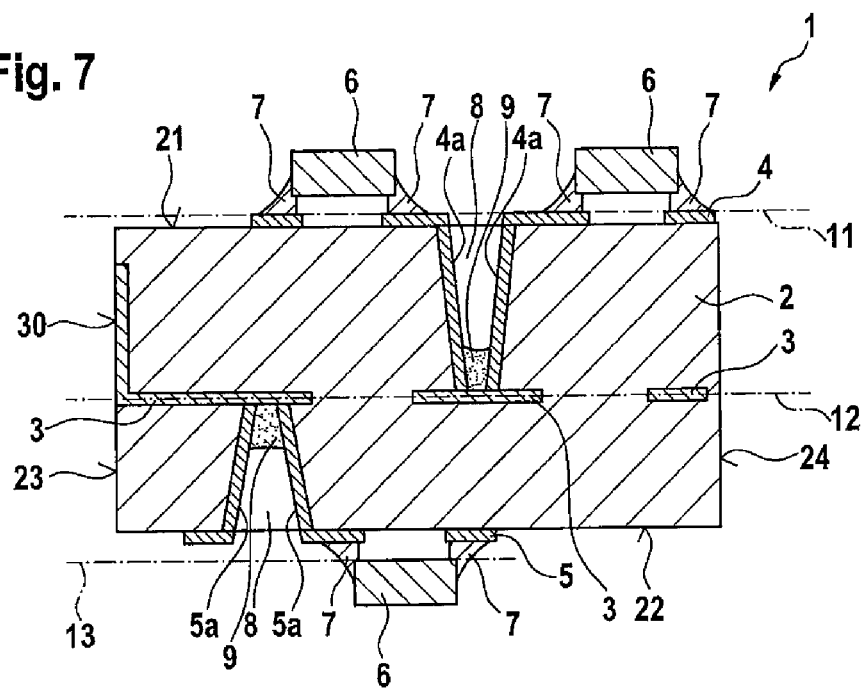

CIRCUIT CARRIER AND METHOD FOR PRODUCING A CIRCUIT CARRIER

This application claims priority under 35 U.S.C. §119 to German patent application no. DE 10 2010 041 121.3, filed Sep. 21, 2010 in Germany, the disclosure of which is incorporated herein by reference in its entirety.

BACKGROUND

The present disclosure relates to a circuit carrier, and to a method for producing a circuit carrier of this type.

Circuit carriers, such as e.g. molded interconnected devices (MID), are used in various configurations in the prior art. Known circuit carriers usually have, on a flat side, conductor tracks which are populated with electronic components. In this case, the electronic components can be fixed on the circuit carriers by means of an electrically conductive adhesive for the purpose of electrical connection and by means of a fixing adhesive for the purpose of mechanical connection. One area of use for circuit carriers of this type is sensors, for example, which are used in vehicles. A circuit carrier of this type is known from DE 10 2007 031 980 A1, for example, wherein the circuit carrier is arranged on a carrier component and can only be populated on one side.

SUMMARY

By comparison therewith, the circuit carrier according to the disclosure has the advantage that it has at least one further plane in which lines run and/or electronic components or the like can be arranged. In this case, according to the disclosure, one plane is situated in the form of conductor tracks on one of the flat sides of a base body and the second plane is situated in a plate-type leadframe running in the interior of the base body. It is thereby possible to achieve very short line paths between the leadframe and the outer conductor track, which has a very positive effect on electromagnetic compatibility (EMC) and also serves for better rerouting of the circuit carrier.

Preferred developments of the features of the disclosure are set forth below.

Preferably, the base body has at least one cutout which extends from the flat side to which the conductor track is applied as far as the leadframe. In this case, part of the conductor track also runs into the cutout to the leadframe, in order to produce an electrical contact with the leadframe. Preferably, the cutout is embodied with a size such that electronic components can also be arranged therein.

In accordance with a further preferred configuration of the disclosure, a third plane with a conductor track is provided on a second flat side of the base body. Consequently, this preferred circuit carrier overall comprises three planes having conduction functions, namely the two outer conductor tracks and also the inner leadframe.

Particularly preferably, the base body is an integral injection-molded part composed of plastic. The integral injection-molded part can also be produced from two or more different plastics. As a result, the base body can simply be injection-molded around the leadframe.

With further preference, an electrically conductive material, e.g. conductive adhesives or solders or molten metal powder, which is applied, is arranged at a hole end of the cutout in order to produce a reliable electrical contact between the leadframe and the conductor track projecting into the cutout. The electrically conductive material introduced into the hole end can ensure a reliable electrical contact, particularly in the case of temperature changes at the circuit carrier, since the leadframe and the base body usually have different coefficients of thermal expansion, as a result of which, in the extreme case, cracks can arise at the interfaces between the two components, which could lead to an interruption of the electrical contact.

In accordance with a further preferred configuration of the disclosure, a partial region of the leadframe is bent over at a narrow side of the base body. Particularly preferably, this partial region of the leadframe is in this case bent over by 90° at the narrow side. As a result, a narrow-side contact can be provided at the circuit carrier, which leads to a further reduction of the number of components.

With further preference, the cutout formed in the base body is provided in such a way that it passes completely through the base body. In this case, the cutout also passes through the leadframe arranged in the interior of the base body at a correspondingly formed cutout in the leadframe. By means of the continuous cutout, it is possible to produce an electrical contact from both flat sides of the base body with the leadframe or a contact passing through the leadframe can be produced without the connection to the leadframe between the two flat sides.

In order to reduce the number of parts, the base body is preferably produced in integral fashion. However, it is also possible for two base body parts, which accommodate the leadframe between them, to be joined together.

The method according to the disclosure for producing a circuit carrier has the advantage that it can be carried out in a very simple and cost-effective manner and a circuit carrier having an improved electromagnetic compatibility can be provided. The method according to the disclosure comprises the steps of providing a plate-type leadframe having two flat sides, surrounding the leadframe with a base body in such a way that the leadframe is at least partly surrounded by the base body at the two flat sides and is arranged in the interior of the base body, and applying a conductor track to an outer flat side of the base body. In this case, it should be noted that the leadframe can be encapsulated with the base body by injection molding, or that two base body parts can be provided, which accommodate the leadframe between them, and the two base body parts are then connected to one another, e.g. by means of adhesive bonding.

Preferably, the method according to the disclosure comprises an additional step of introducing cutouts into the base body, wherein the cutouts extend at least as far as the leadframe, and wherein parts of the conductor tracks are also formed in the cutout, in order to produce an electrical contact with the leadframe. The cutouts can be produced in a simple and cost-effective manner by means of laser drilling, for example, since the leadframe serves as a natural barrier on account of its high reflectance. In this case, a depth of the cutout is preferably up to 1 mm. In this case, the cutouts can be introduced from both flat sides of the base body. Furthermore, it is also possible for the cutouts to be produced as passage openings running through the entire thickness of the base body.

With further preference, the method according to the disclosure for producing the conductor track on the flat side of the base body comprises firstly the step that conductor track traces are applied on the base body by means of a laser, and then the conductor tracks are plated on the conductor track traces applied in this way. Alternatively, the conductor tracks are produced by means of a successive 2-component injection molding process, wherein the injection molding process is performed with a first, non-plateable plastic and a second, plateable plastic, and the conductor track is then plated onto the second, plateable plastic. In this case, it is possible firstly for the first, non-plateable plastic to be injected and for the second, plateable plastic to be injected onto the intermediate body thus produced, in accordance with the desired structures of the conductor track, and then for the conductor tracks to be plated thereon. Alternatively, however, it is possible firstly for the second, plateable plastic to be injected and then, in a further step, for the first, non-plateable plastic to be injected onto the second plastic.

In order to provide a reliable electrical connection, the method furthermore also comprises a step of applying electrically conductive material, in particular conductive adhesive or solder or molten metal powder, in hole ends of the cutouts in the base body, such that a reliable electrical connection between the leadframe and the conductor tracks is obtained.

In accordance with a further preferred configuration of the method according to the disclosure, a region of the leadframe that projects beyond the base body is bent over, preferably bent over by 90°, such that the projecting part of the leadframe bears against a narrow side of the base body. An additional electrical contact can thereby be formed. Alternatively, projecting regions of the leadframe can also be removed, e.g. by bending or stamping or sawing. The bending-over can be effected before the production of the base body or after the production of the base body. Additionally or alternatively, projecting regions can be separated at other narrow sides.

A cutout produced by means of a laser has e.g. a diameter of approximately 500 μm. In this case, the cutout can be cylindrical or alternatively taper in the direction of the leadframe, in particular taper conically.

The circuit carrier according to the disclosure can then be populated in the usual way by means of electronic components that are fixed to the conductor tracks e.g. by means of conductive adhesive.

The circuit carrier according to the disclosure is particularly preferably used in a sensor in vehicles.

BRIEF DESCRIPTION OF THE DRAWING

Preferred exemplary embodiments of the disclosure are described in detail below with reference to the accompanying drawing, in which:

FIG. 7 shows a schematic view of a circuit carrier in accordance with a second exemplary embodiment of the disclosure.

DETAILED DESCRIPTION

A circuit carrier 1 in accordance with a first preferred exemplary embodiment of the disclosure is described in detail below with reference to FIGS. 1 to 6.

Figure 1:
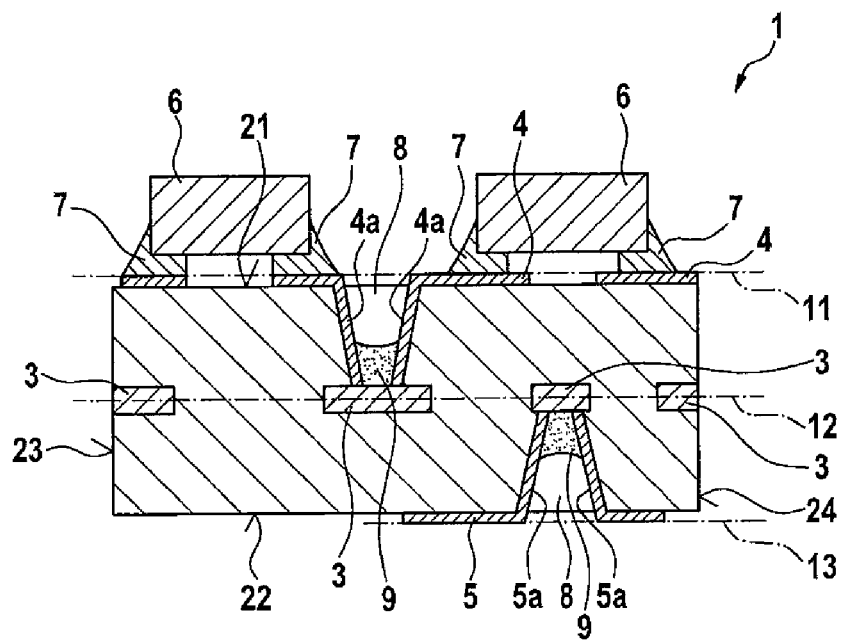
FIG. 1 shows a schematic sectional view of a circuit carrier in accordance with a first exemplary embodiment of the disclosure.

As can be seen from FIG. 1, the circuit carrier 1 comprises an integral base body 2 having a first flat side 21 and a second flat side 22 and also four narrow sides, only two of which are designated by the reference symbols 23 and 24 in FIG. 1. The circuit carrier 1 furthermore comprises a leadframe 3, which is arranged in the interior of the base body 2, a first conductor track 4 on the first flat side 21 of the base body and a second conductor track 5 on the second flat side 22 of the base body.

As can be seen from FIG. 1, the first conductor track 4 is arranged in a first plane 11, the leadframe 3 is arranged in a second plane 12, and the second conductor track 5 is arranged in a third plane 13. In this case, the second plane 12, in which the leadframe 3 is arranged, is arranged centrally in the base body 2. In this case, the three conduction planes are arranged parallel to one another.

As can furthermore be seen from FIG. 1, a plurality of cutouts 8 are provided in the base body 2. The cutouts 8 are produced by means of laser drilling, e.g. by means of a $CO_2$ laser, and have an inwardly conically tapering form. In this case, laser drilling has the advantage that the leadframe 3 acts as a natural barrier on account of its high reflectance. The cutouts 8 are provided from both sides of the base body and parts 4a and 5a of the conductor tracks 4 and 5 run at the edge of the cutouts 8 as far as the hole end onto the leadframe 3. As can be seen from FIG. 1, the hole end of the cutouts 8 is filled by means of a conductive adhesive 9, as a result of which it is possible to compensate for different thermal expansions in the case of temperature changes between the base body 2 and the leadframe 3 by means of the conductive adhesive 9, without an electrical contact being interrupted.

Furthermore, the circuit carrier 1 comprises a plurality of electronic components 6, which are adhesively bonded onto the first conductor track 4 and the second conductor track 5 (not illustrated) by means of conductive adhesive 7.

The circuit carrier 1 according to the disclosure thus has a central second plane 12, which can be connected by means of very short line sections to the first conductor track 4 in the first plane 11 and the second conductor track 5 in the second plane 13. On account of the very short redistribution wiring between the planes, it is possible to obtain a very positive influence on the electromagnetic behavior of the circuit carrier 1. It should be noted that, if appropriate, the cutouts 8 can also be provided completely through the base body 2, such that the first conductor track 4 can be connected to the second conductor track 5 directly through the cutout 8. Consequently, better rerouting of the layouts of the conductor track can also be made possible according to the disclosure.

A method according to the disclosure for producing a circuit carrier 1 as shown in FIG. 1 is described below with reference to FIGS. 2 to 6.

Figure 2:
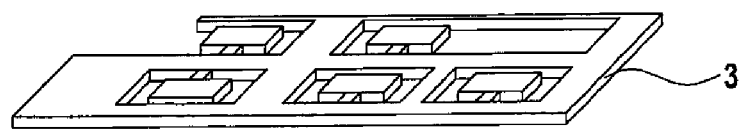
FIG. 2 shows a perspective view of a leadframe incorporated in the circuit carrier from FIG. 1, FIGS. 3 to 6 show schematic views of steps for the production of the circuit carrier shown in FIG. 1.

FIG. 2 shows the leadframe 3 provided as a starting element, said leadframe having a thickness of 0.2 mm, for example, and being produced from an electrically conductive material, such as e.g. copper or a copper-tin compound. In a next step, the leadframe 3 is clamped into an injection mold and then the base body 2 composed of a plastic material is injection-molded around the leadframe 3. In this case, the encapsulation by injection molding can be effected in such a way that the leadframe is completely surrounded by the base body or, as shown in FIG. 3, edge regions 3a of the leadframe project from the base body 2. In this case, the leadframe 3 is arranged parallel to the flat sides 21, 22 of the base body 2 and centrally in the base body 2. As indicated by the arrow A in FIG. 3, in a next step, the edge regions 3a of the leadframe 3 are bent over and broken off. An intermediate product as shown in FIG. 4 is then obtained. The intermediate product from FIG. 4 is therefore the parallelepipedal base body with encapsulated leadframe 3.

In a next step, as shown in FIG. 5, cutouts 8 are introduced by means of laser drilling, wherein the cutouts 8 extend as far as the leadframe 3. Alternatively, it is also possible for the cutouts 8 already to be produced during the injection molding process for producing the base body 2 by means of corresponding configuration of the injection mold. Afterwards, by means of a laser, conductor track traces are applied to the surfaces of the first and second flat sides 21, 22 of the base body 2 and into the cutouts and the first and second conductor tracks are subsequently applied on the front and rear sides by plating by means of copper, nickel or gold. In this case, the conductor track regions 4a, 5a are also formed in the cutouts 8 (cf. FIG. 6). Afterwards, the conductive adhesive 9 is introduced into the hole ends of the cutouts 8 and then the desired electronic components 6 are applied on the first and second conductor tracks 4, 5.

Alternatively, the circuit carrier 1 can also be produced in such a way that a 2-component injection molding process with a first, non-plateable plastic and a second, plateable plastic is performed. In this case, it is possible firstly for the first or second plastic to be injected. In this case, the cutouts 8 in the base body can be produced by means of corresponding injection molds during the injection molding process or, alternatively, can be produced by drilling after the injection molding process. Afterwards, the conductor track structures provided by the second plastic are plated. The further steps such as providing the conductive adhesive 9 in the hole ends and population with electronic components are then effected as in the alternative described previously.

The method according to the disclosure can therefore provide a circuit carrier 1 having a plurality of conduction planes 11, 12, 13 arranged parallel to one another. This results in an improved electromagnetic compatibility. Moreover, improved rerouting of the conduction structures can be made possible by means of the three parallel planes.

FIG. 7 shows a circuit carrier 1 in accordance with a second exemplary embodiment of the disclosure, wherein identical or functionally identical parts are designated by the same reference symbols as in the first exemplary embodiment. The circuit carrier 1 of the second exemplary embodiment essentially corresponds to that of the first exemplary embodiment, wherein, in contrast thereto, during the injection molding of the base body 2 around the leadframe 3, remaining projections are bent over by 90° to form an additional contact area 30. Consequently, a simple and reliable contact with the circuit carrier 1 can be produced by means of the contact area 30, such that, if appropriate, contact-making components, such as e.g. contact rivets, can be dispensed with. In this second exemplary embodiment shown in FIG. 7, the surface of the contact region 30 is in one plane with the surface of the narrow side 23. However, it is also possible for the contact area 30 to project by its thickness from the narrow side 23. Otherwise, this exemplary embodiment corresponds to the previous exemplary embodiment, such that reference can be made to the description given there. The two alternative production methods described in the previous exemplary embodiment can also be applied to the second exemplary embodiment.

With regard to the two exemplary embodiments described, it should be noted that it is also possible for more than three conductive planes to be provided. By way of example, two or more leadframes can be surrounded by the base body and can be connected to one another and/or to conductor tracks on the flat sides via cutouts.

What is claimed is:

1. A circuit carrier, comprising:
    a base body having a first exterior surface, a second opposite exterior surface, and a plurality of narrow sides, the first and second exterior surfaces and the plurality of narrow sides defining an interior;
    a first conductor track positioned partially on the first exterior surface; and
    a leadframe arranged at least partially within the interior, wherein the base body includes at least one cutout cut into the first exterior surface and extending from the first exterior surface into the interior to the leadframe, and
    wherein a first portion of the first conductor track extends into the cutout to the leadframe to electrically connect a second portion of the first conductor track positioned on the first exterior surface to the leadframe.

2. The circuit carrier according to claim 1, further comprising a second conductor track applied at least partially on the second exterior surface.

3. The circuit carrier according to claim 1, wherein the base body is an integral injection-molded part.

4. The circuit carrier according to claim 1, further comprising an electrically conductive material arranged at a hole end of the cutout so as to produce an electrical contact between the leadframe and the first portion of the first conductor track.

5. The circuit carrier according to claim 1, wherein a partial region of the leadframe is bent over along a first narrow side of the plurality of narrow sides of the base body.

6. A method for producing a circuit carrier, comprising:
    encapsulating a plate-type leadframe having two flat sides with a base body by injection molding in such a way that the leadframe is at least partly surrounded by the base body at both flat sides, the base body includes a first exterior surface, a second opposite exterior surface, and a plurality of narrow sides, and the first and second exterior surfaces and the plurality of narrow sides define an interior;
    introducing cutouts into the first exterior surface extending from the first exterior surface into the interior to the leadframe;
    applying a first portion of a conductor track to the first exterior surface of the base body;
    applying a second portion of the conductor track in the cutouts; and
    connecting the conductor track to the leadframe in an electrically conductive manner.

7. The method according to claim 6, introducing the cutouts further comprising:
    drilling the cutouts with a laser.

8. The method according to claim 6, applying the first portion of the conductor track further comprising:
    applying conductor track traces on the base body first exterior surface with a laser; and
    plating the conductor track on the applied conductor track traces.

9. The method according to claim 6, further comprising:
    introducing an electrically conductive material into a hole end of the cutout so as to produce an electrical connection between the leadframe and the conductor track.

10. The method according to claim 6, further comprising:
    bending a partial region of the leadframe over at a first narrow side of the plurality of narrow sides of the base body.

11. The circuit carrier according to claim 4, wherein the electrically conductive material is one of a conductive adhesive, a solder, and a molten metal powder.

12. The circuit carrier according to claim 5, wherein the partial region of the leadframe is bent over by 90° at the first narrow side of the base body.

13. The method according to claim 9, wherein the electrically conductive material is one of a conductive adhesive, a solder, and a molten metal powder.

14. The method according to claim 10, wherein the partial region of the leadframe is bent over by 90° at the first narrow side of the base body.

15. The circuit carrier according to claim 1, wherein partial regions of the leadframe are separated.

16. The method according to claim 6, further comprising:
concomitantly injection-molding the cutouts during the encapsulation of the leadframe by use of correspondingly formed injection molds.

17. The method according to claim 6, applying the first portion of the conductor track further comprising:
performing a successive 2-component injection molding process with a first, non-plateable plastic and a second, plateable plastic; and
plating the conductor track on the second, plateable plastic,
wherein one of the first, non-plateable plastic and the second, plateable plastic is injected before the other of the first, non-plateable plastic and the second, plateable plastic.

18. The circuit carrier according to claim 1, wherein the leadframe, the first exterior surface, and the second exterior surface are defined substantially in planes that are parallel with one another.

19. The circuit carrier according to claim 1, wherein the leadframe includes a first flat side and a second flat side, and the leadframe is arranged in the interior such that the first flat side and the second flat side are at least partially encapsulated by the interior.

* * * * *